United States Patent
Hu et al.

(10) Patent No.: US 8,866,207 B2
(45) Date of Patent: Oct. 21, 2014

(54) MAGNETIC STACKS WITH PERPENDICULAR MAGNETIC ANISOTROPY FOR SPIN MOMENTUM TRANSFER MAGNETORESISTIVE RANDOM ACCESS MEMORY

(75) Inventors: Guohan Hu, Yorktown Heights, NY (US); Janusz J. Nowak, Highland Mills, NY (US); Philip L. Trouilloud, Norwood, NJ (US); Daniel C. Worledge, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 130 days.

(21) Appl. No.: 13/602,533

(22) Filed: Sep. 4, 2012

(65) Prior Publication Data

US 2013/0005051 A1 Jan. 3, 2013

Related U.S. Application Data

(63) Continuation of application No. 13/093,287, filed on Apr. 25, 2011, now abandoned.

(51) Int. Cl.
*G11B 5/39* (2006.01)
*H01L 43/08* (2006.01)
*G11C 11/16* (2006.01)
*H01L 43/10* (2006.01)
*H01L 43/12* (2006.01)

(52) U.S. Cl.
CPC ............... *G11C 11/16* (2013.01); *H01L 43/08* (2013.01); *H01L 43/10* (2013.01); *H01L 43/12* (2013.01)
USPC .................... 257/296; 257/E43.004; 365/158

(58) Field of Classification Search
USPC ........... 257/296, E43.004; 365/158, 171, 173
See application file for complete search history.

(56) References Cited

U.S. PATENT DOCUMENTS

| | | | | |
|---|---|---|---|---|
| 5,801,984 | A | * | 9/1998 | Parkin ........................... 365/158 |
| 6,166,948 | A | | 12/2000 | Parkin et al. |
| 6,347,049 | B1 | | 2/2002 | Childress et al. |
| 6,612,018 | B1 | | 9/2003 | Gill |
| 6,845,038 | B1 | | 1/2005 | Shukh |

(Continued)

OTHER PUBLICATIONS

Sankha Subhra Mukherjee, "Realization of CoFeB/MgO/CoFeB Magnetic Tunnel Junction Devices Through Materials Analysis, Process Integration and Circuit Simulation," A Dissertation, Rochester Institue of Technology, pp. 1-218, Dec. 2009.*

(Continued)

*Primary Examiner* — Thomas L Dickey
(74) *Attorney, Agent, or Firm* — Cantor Colburn LLP; Vazken Alexanian (57) ABSTRACT

A magnetic tunnel junction (MTJ) includes a magnetic free layer, having a variable magnetization direction; an insulating tunnel barrier located adjacent to the free layer; a magnetic fixed layer having an invariable magnetization direction, the fixed layer disposed adjacent the tunnel barrier such that the tunnel barrier is located between the free layer and the fixed layer, wherein the free layer and the fixed layer have perpendicular magnetic anisotropy; and one or more of: a composite fixed layer, the composite fixed layer comprising a dusting layer, a spacer layer, and a reference layer; a synthetic antiferromagnetic (SAF) fixed layer structure, the SAF fixed layer structure comprising a SAF spacer located between the fixed layer and a second fixed magnetic layer; and a dipole layer, wherein the free layer is located between the dipole layer and the tunnel barrier.

25 Claims, 8 Drawing Sheets

(56) References Cited

U.S. PATENT DOCUMENTS

| | | |
|---|---|---|
| 6,870,711 B1 | 3/2005 | Zhao et al. |
| 7,083,988 B2 | 8/2006 | Deak |
| 7,092,284 B2 | 8/2006 | Braun et al. |
| 7,313,013 B2 | 12/2007 | Sun et al. |
| 7,345,854 B2 | 3/2008 | Takano |
| 7,663,131 B2 | 2/2010 | Horng et al. |
| 7,705,340 B2 | 4/2010 | Lin |
| 7,768,824 B2 | 8/2010 | Yoshikawa et al. |
| 2004/0120184 A1 | 6/2004 | Janesky et al. |
| 2005/0186357 A1 | 8/2005 | Hattori et al. |
| 2006/0081952 A1 | 4/2006 | Lin |
| 2006/0204792 A1 | 9/2006 | Osawa |
| 2007/0063236 A1 | 3/2007 | Huai et al. |
| 2007/0278547 A1 | 12/2007 | Pietambaram et al. |
| 2008/0231998 A1 | 9/2008 | YoshiKawa et al. |
| 2008/0291585 A1 | 11/2008 | Yoshikawa et al. |
| 2009/0213503 A1 | 8/2009 | Sun et al. |
| 2010/0039181 A1 | 2/2010 | Firastrau et al. |
| 2010/0078741 A1 | 4/2010 | Zheng et al. |
| 2010/0096716 A1 | 4/2010 | Ranjan et al. |
| 2010/0109109 A1 | 5/2010 | Chen et al. |
| 2010/0148167 A1 | 6/2010 | Whig et al. |
| 2010/0178528 A1 | 7/2010 | Tsunekawa et al. |
| 2010/0320550 A1 | 12/2010 | Abraham et al. |
| 2011/0062538 A1 | 3/2011 | Rizzo et al. |
| 2011/0064969 A1 | 3/2011 | Chen et al. |
| 2011/0159316 A1 | 6/2011 | Wang et al. |
| 2012/0205759 A1 | 8/2012 | Hu |

OTHER PUBLICATIONS

Ciaran Fowley, et al.,"Perpendicular Magnetic Anisotropy in CoFeB/Pd Bilayers," IEEE Transactions on Magnetics, Vol14, No. 6, pp. 2116-2118, Jun. 2010.*

International Preliminary Report on Patentability for International Application No. PCT/US2012/209141; International Filing Date: Mar. 15, 2012; Mailing Date: Nov. 7, 2013; 8 pgs.

Ciaran Fowley, et al.,"Perpendicular Magnetic Anisotropy in CoFeB/Pd Bilayers," IEEE Transactions on Magnetics, vol. 14, No. 6, pp. 2116-2118, Jun. 2010.

International Search Report; International Application No. PCT/US2012/029141; International Filing Date: Mar. 15, 2012; Date of Mailing: Jun. 2, 2012; pp. 1-7.

International Search Report—Written Opinion; International Application No. PCT/US2012/029141; International Filing Date: Mar. 15, 2012; Date of Mailing: Jun. 2, 2012; pp. 1-6.

J.H. Jung et al., "Strong perpendicular magnetic anisotrophy in thick CoFeB films sandwiched by Pd and MgO layers", Appl. Phys. Lett. 96, 042503, 2010.

K. Mizunuma et al., "MgO barrier-perpendicular magnetic tunnel junctions with CoFe/Pd multilayers and ferromagnetic insertion layers," Appl. Phys. Lett. 95, 232516, 2009.

\* cited by examiner

MAGNETIC STACKS WITH PERPENDICULAR MAGNETIC ANISOTROPY FOR SPIN MOMENTUM TRANSFER MAGNETORESISTIVE RANDOM ACCESS MEMORY

CROSS-REFERENCE TO RELATED APPLICATION

This application is a continuation of U.S. patent application Ser. No. 13/093,287, filed Apr. 25, 2011, the disclosure of which is incorporated by reference herein in its entirety.

BACKGROUND

This disclosure relates generally to the field of magnetoresistive random access memory (MRAM), and more specifically to spin momentum transfer (SMT) MRAM.

MRAM is a type of solid state memory that uses tunneling magnetoresistance (MR) to store information. MRAM is made up of an electrically connected array of magnetoresistive memory elements, referred to as magnetic tunnel junctions (MTJs). Each MTJ includes a magnetic free layer having a magnetization direction that is variable, and a magnetic fixed layer having a magnetization direction that is invariable. The free layer and fixed layer are separated by an insulating non-magnetic tunnel barrier. An MTJ stores information by switching the magnetization state of the free layer. When the magnetization direction of the free layer is parallel to the magnetization direction of the fixed layer, the MTJ is in a low resistance state. When the magnetization direction of the free layer is anti-parallel to the magnetization direction of the fixed layer, the MTJ is in a high resistance state. The difference in resistance of the MTJ may be used to indicate a logical '1' or '0', thereby storing a bit of information. The MR of an MTJ determines the difference in resistance between the high and low resistance states. A relatively high difference between the high and low resistance states facilitates read operations in the MRAM.

The magnetization state of the free layer may be changed by a spin torque switched (STT) write method, in which a write current is applied in a direction perpendicular to the film plane of the magnetic films forming the MTJ. The write current has a tunneling magnetoresistive effect, so as to change (or reverse) the magnetization state of the free layer of the MTJ. In STT magnetization reversal, the write current required for the magnetization reversal is determined by the current density. As the area of the surface in an MTJ on which the write current flows becomes smaller, the write current required for reversing the magnetization of the free layer of the MTJ becomes smaller. Therefore, if writing is performed with fixed current density, the necessary write current becomes smaller as the MTJ size becomes smaller.

MTJs that include material layers that exhibit perpendicular anisotropy (PMA) may be switched with a relatively low current density as compared to MTJs having in-plane magnetic anisotropy, also lowering the total necessary write current. However, MTJs made using PMA materials may have a relatively low MR because of structural and chemical incompatibility between the various material layers that comprise a PMA MTJ. A relatively low MR may result in difficulty with read operations in the STT MRAM, as the difference in resistance between the high and low resistance states of the MTJs will also be relatively low. In a PMA MTJ, the fixed layer and the free layer may be magnetized in directions that are parallel or anti-parallel to one another, and the fixed layer may apply a relatively strong dipolar field to the free layer. The fixed layer dipolar field may offset the free layer loop by about 1000 oersteds (Oe) or more. The free layer $H_c$ needs to be higher than the offset field from the fixed layer; otherwise, there is only one stable resistance state instead of the two stable resistance states (referred to as bistability) needed to store information in the MTJ.

MRAM is formed from a layered sheet comprising a magnetic stack of the various MTJ layers that is patterned to form individual MTJs. The MTJs may take the form of relatively small cylinders, each comprising the layered magnetic stack. In a sheet film, there is a Neel coupling between the various layers, and the fixed layer dipolar field is not present. The fixed layer dipolar field becomes apparent after the MTJs are patterned, as the dipolar field originates at the edge of the MTJ device. The fixed layer dipolar field becomes stronger as the MTJs are made smaller and is non-uniform across an MTJ. The fixed layer dipolar field creates a number of issues in MTJ devices, including increasing the free layer loop offset and the minimum required free layer $H_c$ needed to ensure bistability of the MTJ. The minimum free layer $H_c$ must be maintained across the full temperature operating range of the device. The fixed layer dipolar field may also change the switching mode of an MTJ, and the impact on device functionality increases as MTJ size is scaled down.

BRIEF SUMMARY

In one aspect, a magnetic tunnel junction (MTJ) for a magnetic random access memory (MRAM) includes a magnetic free layer, having a variable magnetization direction; an insulating tunnel barrier located adjacent to the free layer; a magnetic fixed layer having an invariable magnetization direction, the fixed layer disposed adjacent the tunnel barrier such that the tunnel barrier is located between the free layer and the fixed layer, wherein the free layer and the fixed layer have perpendicular magnetic anisotropy; and one or more of: a composite fixed layer, the composite fixed layer comprising a dusting layer, a spacer layer, and a reference layer, wherein the spacer layer is located between the reference layer and the tunnel barrier, and wherein the dusting layer is located between the spacer layer and the tunnel barrier; a synthetic antiferromagnetic (SAF) fixed layer structure, the SAF fixed layer structure comprising a SAF spacer located between the fixed layer and a second fixed magnetic layer, wherein the fixed layer and the second fixed magnetic layer are anti-parallely coupled through the SAF spacer; and a dipole layer, wherein the free layer is located between the dipole layer and the tunnel barrier.

In another aspect, a method of forming a magnetic tunnel junction (MTJ) for a magnetic random access memory (MRAM) includes forming a magnetic free layer having a variable magnetization direction; forming a tunnel barrier over the free layer, the tunnel barrier comprising an insulating material; forming a magnetic fixed layer having an invariable magnetization direction over the tunnel barrier, wherein the free layer and the fixed layer have perpendicular magnetic anisotropy; and forming one or more of: a composite fixed layer, the composite fixed layer comprising a dusting layer, a spacer layer, and a reference layer, wherein the spacer layer is located between the reference layer and the tunnel barrier, and wherein the dusting layer is located between the spacer layer and the tunnel barrier; a synthetic antiferromagnetic (SAF) fixed layer structure, the SAF fixed layer structure comprising a SAF spacer located between the fixed layer and a second fixed magnetic layer, wherein the fixed layer and the second fixed magnetic layer are anti-parallelly coupled through the SAF spacer; and a dipole layer, wherein the free layer is located between the dipole layer and the tunnel barrier.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of PMA magnetic stacks for STT MRAM are provided, with exemplary embodiments being discussed below in detail. The PMA magnetic stacks form MTJs that exhibit a high MR and a reduced fixed layer dipolar field thus commensurately reduced free layer loop offset through inclusion of one or more of a composite fixed layer, a synthetic antiferromagnetic (SAF) structure in the fixed layer, and a dipole layer. A composite fixed layer includes three layers: a dusting layer, a spacer layer, and a reference layer. A fixed layer SAF structure includes a SAF spacer located between two layers of magnetic material that are anti-parallelly coupled through the SAF spacer. The magnetization of the two layers of magnetic material in the SAF structure may be adjusted such that they are aligned opposite to one another, reducing the overall fixed layer dipole field. A dipole layer is located on the opposite side of the free layer from the tunnel barrier, and may be magnetized in a direction opposite to the fixed layer to cancel out the fixed layer dipole field. A PMA MTJ may be formed with one or more of the composite fixed layer, the SAF structure, and the dipole layer, in any combination, to reduce the fixed layer dipole field and free layer loop offset of the PMA MTJ.

Figure 1:
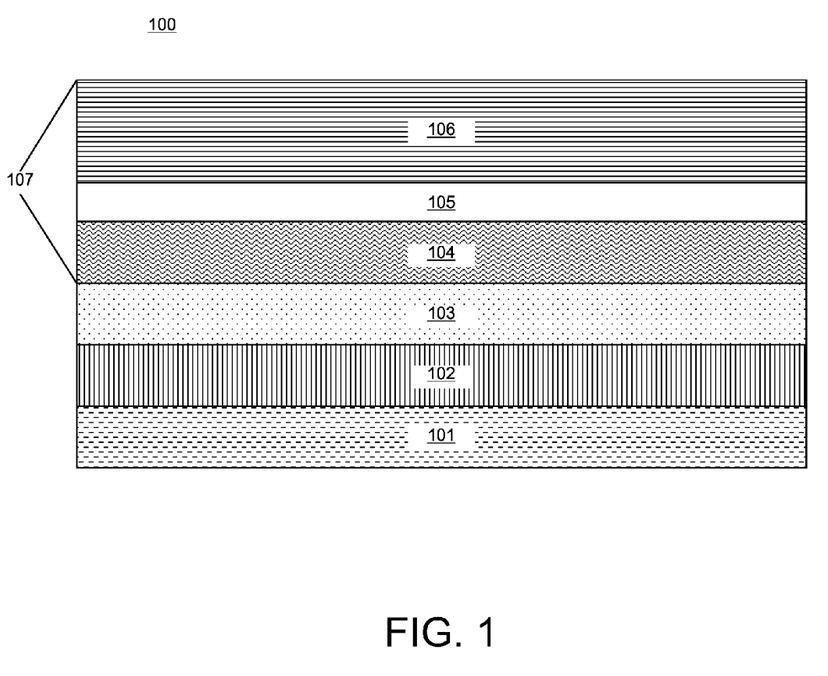
FIG. 1 is a cross sectional view illustrating an embodiment of a magnetic stack with a composite fixed layer on top of the magnetic stack.

Referring initially to FIG. 1, there is shown a cross sectional view of a PMA magnetic stack 100 with a composite fixed layer 107. The composite fixed layer 107 includes dusting layer 104, spacer 105, and reference layer 106. The MTJ 100 also includes a free layer 102 that is grown on a seed layer 101. Seed layer 101 may include tantalum (Ta), or tantalum magnesium (TaMg) with a percentage of Mg that is less than 20%, in some embodiments. The thickness of seed layer 102 may be about 0.5 nanometers (nm) or more, and from about 1 nm to about 3 nm in some exemplary embodiments. Free layer 102 may include cobalt-iron-boron (CoFeB) with various compositions; the Co composition may be less than 90%, and the Fe may be from about 10% to about 100% (pure Fe) in various embodiments. Free layer 102 may also comprise CoFeB|Fe or Fe|CoFeB. The thickness of the free layer 102 may be from about 0.6 nm to about 2 nm, depending on the composition of free layer 102. Tunnel barrier 103 is located on free layer 102, and comprises an insulating material such as magnesium oxide (MgO). An MgO tunnel barrier 103 can be formed by natural oxidation, radical oxidation or radiofrequency (RF) sputtering.

In the embodiment shown in FIG. 1, composite fixed layer 107 is located on top of tunnel barrier 103. The dusting layer 104 and the reference layer 106 are magnetically coupled through the spacer 105 and have PMA. The dusting layer 104 may be pure CoFeB, CoFe, Fe, or bilayers of Fe|CoFeB, CoFe|CoFeB, CoFeB|Fe or CoFeB|CoFe in various embodiments. The thickness of the dusting layer 104 may be from about 0.5 nm to about 2 nm. The spacer 105 comprises a non-magnetic material, such as chromium (Cr), ruthenium (Ru), titanium nitride (TiN), titanium (Ti), vanadium (V), tantalum (Ta), tantalum nitride (TaN), aluminum (Al), magnesium (Mg) or oxides such as MgO in various embodiments. The thickness of the spacer 105 may be from about 0.1 nm to about 1 nm in some embodiments, or thicker than 1 nm in other embodiments; the thickness of spacer 105 must allow dusting layer 104 and reference layer 106 to be magnetically coupled together through spacer 105. The spacer layer 105 may alternately have a tri-layer structure, with a relatively thin center magnetic layer (which may comprise CoFeB, Fe, or CoFe) sandwiched by two non-magnetic layers (which may comprise Cr, Ru, TiN, Ti, V, Ta, TaN, Al, Mg or oxides such as MgO) in some embodiments. For a tri-layer spacer 105, the thickness of the center magnetic layer may be from about 0.1 nm to about 0.5 nm. Reference layer 106 may comprise cobalt-platinum (Co|Pt) or cobalt-palladium (Co|Pd), in multilayers or a mixture, in various embodiments. Additional embodiments of MTJs that may comprise a composite fixed layer including a dusting layer, spacer, and reference layer are shown in FIGS. 2-8; composite fixed layers 204, 307, 406, 507, 606, 707, and 804 may comprise any of the materials, structures, and thicknesses listed above with respect to composite fixed layer 107 of FIG. 1.

Figure 2:
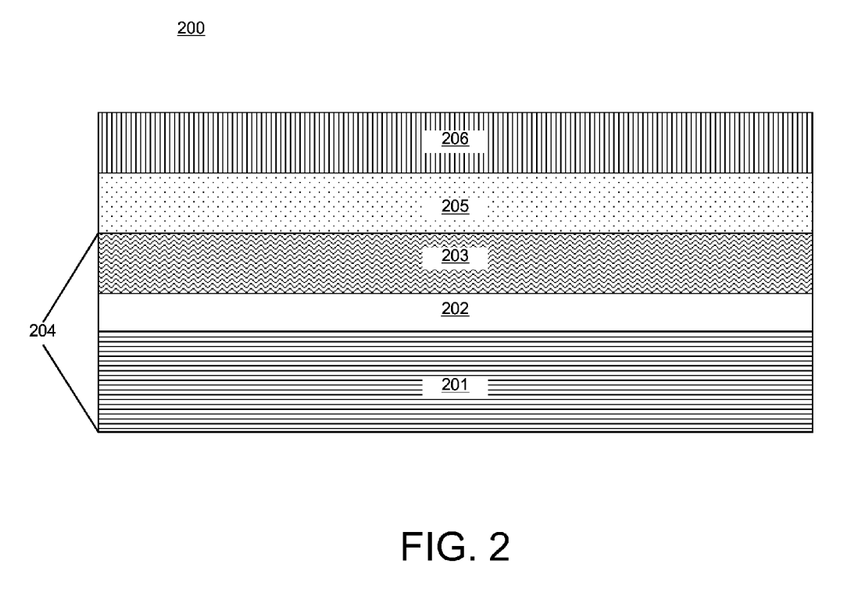
FIG. 2 is a cross sectional view illustrating an embodiment of a magnetic stack with a composite fixed layer on the bottom of the magnetic stack.

FIG. 2 shows an embodiment of a PMA magnetic stack 200 with the composite fixed layer 204 located on the bottom. The composite fixed layer 204 includes dusting layer 203, spacer 202, and reference layer 201. Magnetic stack 200 further includes tunnel barrier 205 and free layer 206. Tunnel barrier 205 comprises an insulating material such as MgO. An MgO tunnel barrier 205 can be formed by natural oxidation, radical oxidation or RF sputtering. Free layer 206 may include CoFeB with various compositions; the Co composition may be less than 90% and the Fe may be from about 10% to about 100% (pure Fe) in various embodiments. Free layer 206 may also comprise CoFeB|Fe or Fe|CoFeB.

Figure 3:
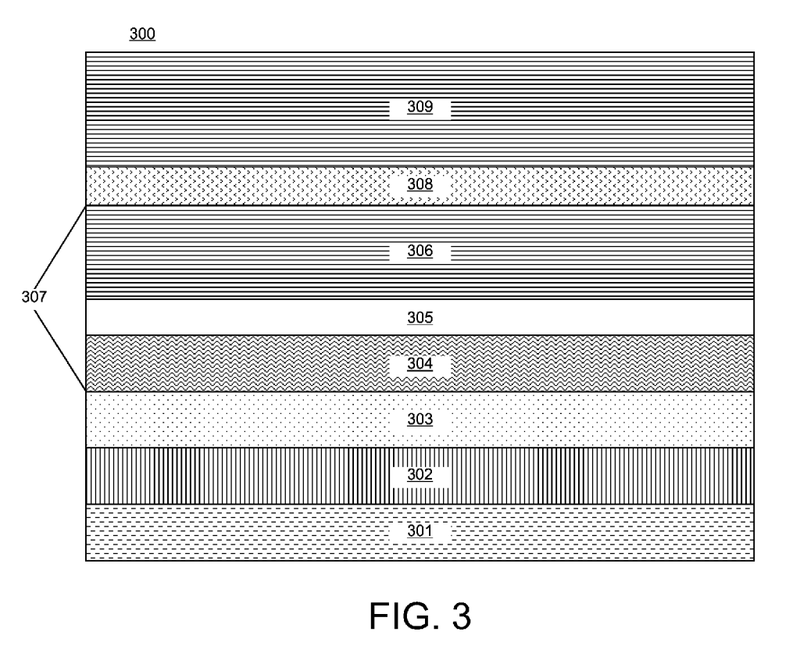
FIG. 3 is a cross sectional view illustrating an embodiment of a magnetic stack with a composite fixed layer and an SAF structure on top of the magnetic stack.
Figure 4:
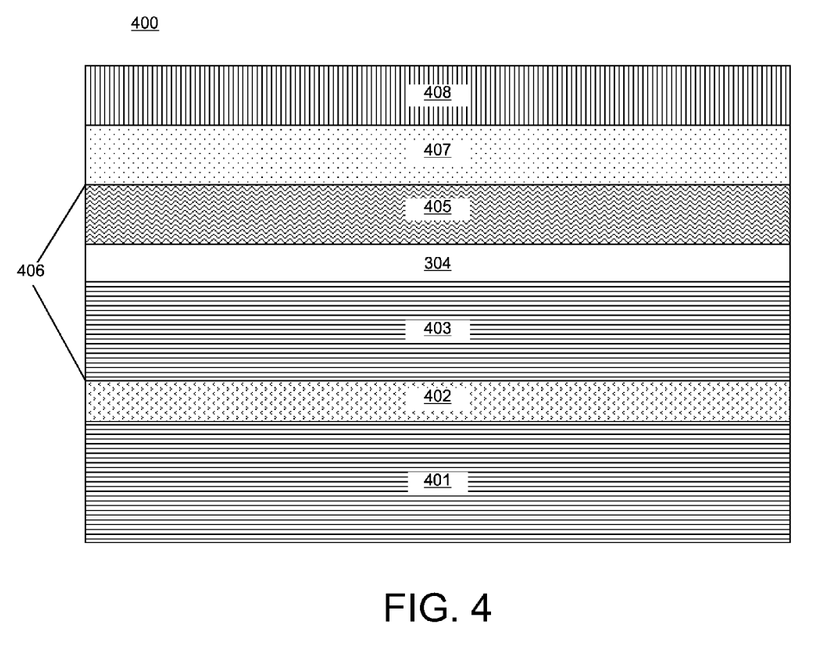
FIG. 4 is a cross sectional view illustrating an embodiment of a magnetic stack with a composite fixed layer and an SAF structure on the bottom of the magnetic stack.

A composite fixed layer may be incorporated into a SAF fixed layer structure, as shown in PMA magnetic stacks 300 and 400 of FIGS. 3 and 4. By adjusting the magnetic moments and the magnetic anisotropy of the magnetic material located on either side of the SAF spacer in the SAF structure such that the magnetic moments are aligned opposite to one another, a reduced fixed layer dipole field and a centered (or zero offset) free layer loop can be obtained. In FIG. 3, composite fixed layer 307, including dusting layer 304, spacer 305, and reference layer 306, is anti-parallelly coupled to a top reference layer 309 through an SAF spacer 308. Top reference layer 309 may comprise cobalt-nickel (Co|Ni), Co|Pd or Co|Pt, in multilayers or a mixture. SAF spacer 308 may comprise Ru, and may be from about 8 angstroms to about 10 angstroms thick in some embodiments. MTJ 300 further includes seed layer 301, free layer 302, and tunnel barrier 303. Seed layer 301 may include Ta, or TaMg with a percentage of Mg that is less than 20%, in some embodiments. The seed layer 301 thickness may be about 0.5 nm or more, and from about 1 nm to about 3 nm in some exemplary embodiments. Free layer 302 may include CoFeB with various compositions; the Co composition may be less than 90% and the Fe may be from about 10% to about 100% (pure Fe) in various embodiments. Free layer 302 may also comprise CoFeB|Fe or Fe|CoFeB. The thickness of the free layer 302 may be from about 0.6 nm to about 2 nm depending on the free layer composition. Tunnel barrier 303 is located on free layer 302, and comprises an insulating material such as MgO. An MgO tunnel barrier 303 can be formed by natural oxidation, radical oxidation or radiofrequency (RF) sputtering. Composite fixed layer 307 may comprise any of the materials, structures, and thicknesses listed above with respect to composite fixed layer 107 of FIG. 1 in some embodiments. In other embodiments of an MTJ with a fixed layer SAF structure, composite fixed layer 307 may be replaced by a simple fixed layer comprising an appropriate magnetic material, omitting dusting layer 304 and spacer 305.

In FIG. 4, PMA magnetic stack 400 includes a composite fixed layer 406, with dusting layer 405, spacer 404, and reference layer 403, anti-parallelly coupled through SAF spacer 402 to bottom reference layer 401. Bottom reference layer 401 may comprise Co|Ni, Co|Pd or Co|Pt, in multilayers or a mixture. SAF spacer 402 may comprise Ru, and may be from about 8 angstroms to about 10 angstroms thick in some embodiments. PMA magnetic stack 400 further includes tunnel barrier 407 and free layer 408. Tunnel barrier 407 comprises an insulating material such as MgO. An MgO tunnel barrier 407 can be formed by natural oxidation, radical oxidation or RF sputtering. Free layer 408 may include CoFeB with various compositions; the Co composition may be less than 90% and the Fe may be from about 10% to about 100% (pure Fe) in various embodiments. Free layer 408 may also comprise CoFeB|Fe or Fe|CoFeB. Composite fixed layer 406 may comprise any of the materials, structures, and thicknesses listed above with respect to composite fixed layer 107 of FIG. 1 in some embodiments. In other embodiments of a PMA magnetic stack with a fixed layer SAF structure, composite fixed layer 406 may be replaced by a simple fixed layer comprising an appropriate magnetic material, omitting dusting layer 405 and spacer 404.

Figure 5:
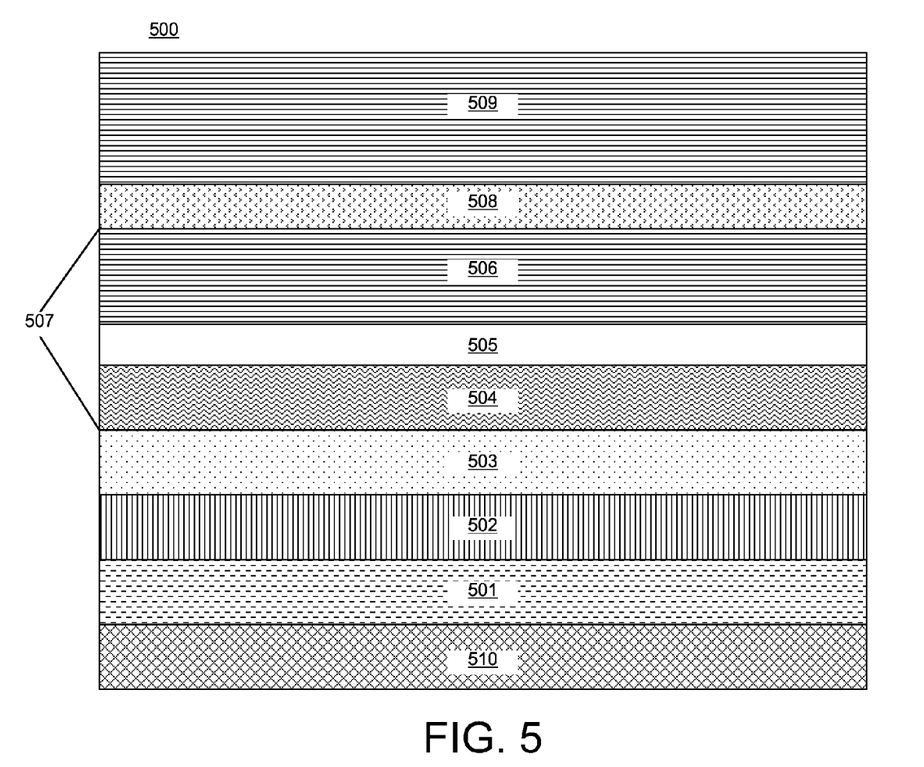
FIG. 5 is a cross sectional view illustrating an embodiment of a magnetic stack with a composite fixed layer and an SAF structure on top of the magnetic stack, and a dipole layer on the bottom of the magnetic stack.
Figure 6:
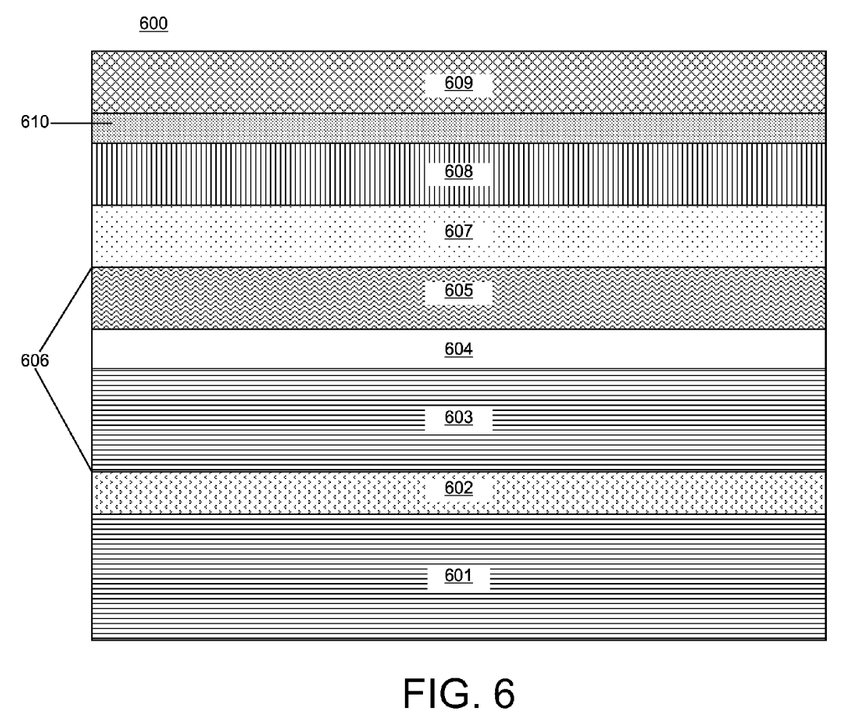
FIG. 6 is a cross sectional view illustrating an embodiment of a magnetic stack with a composite fixed layer and an SAF structure on the bottom of the magnetic stack, and a dipole layer on top of the magnetic stack.

In the embodiments of PMA magnetic stacks 300 and 400 with fixed layer SAF structures shown in FIGS. 3 and 4, because top reference layer 309/bottom reference layer 401 is further away from the free layer 302/408 than the composite fixed layer 307/406, the magnetic moment of top reference layer 309/bottom reference layer 401 has to be larger than the magnetic moment of composite fixed layer 307/406 in order to cancel the dipole field from composite fixed layer 307/406. In the case that both reference layer 306/403 and top reference layer 309/bottom reference layer 401 comprise multilayers, top reference layer 309/bottom reference layer 401 must include more layer repeats, and therefore be thicker, than reference layer 306/403. As top reference layer 309/bottom reference layer 401 is made thicker, the compensation effect of additional layer repeats becomes weaker, as the additional layer repeats are further away from the free layer 302/408. Thicker multilayer stacks may also lead to longer deposition times during magnetic stack fabrication and more materials expense. Therefore, a dipole layer that is magnetized in a direction that is the same as that of top reference layer 309/bottom reference layer 401 and opposite to that of the reference layer 306/403 may be incorporated into the PMA magnetic stack in addition to the fixed layer SAF structure so as to reduce the thickness of the top reference layer 309/bottom reference layer 401 that is necessary to cancel out the dipole field from the composite fixed layer 307/406. Magnetic stacks including a composite fixed layer, a fixed layer SAF structure, and a dipole layer are shown in FIGS. 5 and 6. Alternately, the dipole layer may be incorporated into a PMA magnetic stack that omits the fixed layer SAF structure, as shown below with respect to FIGS. 7 and 8, and the dipole layer may be magnetized in a direction that is opposite to the fixed layer.

The PMA magnetic stack 500 of FIG. 5 includes a fixed layer SAF structure with composite fixed layer 507 anti-parallelly coupled to a top reference layer 509 through an SAF spacer 508. Top reference layer 509 may comprise Co|Ni, Co|Pd or Co|Pt, in multilayers or a mixture. SAF spacer 508 may comprise Ru, and may be from about 8 angstroms to about 10 angstroms thick in some embodiments. The dipole layer 510 may comprise cobalt chromium platinum (CoCrPt), Co|Ni, Co|Pd, or Co|Pt multilayers in some embodiments. To increase the magnetic moment and reduce the thickness of the dipole layer 510, a CoFeB dusting layer (not shown), which has relatively large saturation moment, may be grown directly on top of the CoCrPt, Co|Ni, Co|Pd, or Co|Pt multilayers as part of the dipole layer 510 in some embodiments. Dipole layer 510 is magnetized in a direction that is the same as that of top reference layer 509 and opposite to that of the reference layer 506 to cancel out the fixed layer dipole field and reduce the loop offset of the free layer 502. A seed layer 501 located between the free layer 502 and dipole layer 510 provided magnetic separation between the dipole layer 510 and free layer 502. Seed layer 501 may include Ta, or TaMg with a percentage of Mg that is less than 20%, in some embodiments. The seed layer 501 thickness may be 0.5 nm or more, and from about 1 nm to about 3 nm in some exemplary embodiments. Free layer 502 may include CoFeB with various compositions; the Co composition may be less than 90% and the Fe may be from about 10% to about 100% (pure Fe) in various embodiments. Free layer 502 may also comprise CoFeB|Fe or Fe|CoFeB. The thickness of the free layer 502 may be from about 0.6 nm to about 2 nm depending on the free layer composition. Tunnel barrier 503 is located on free layer 502, and comprises an insulating material such as MgO. An MgO tunnel barrier 503 can be formed by natural oxidation, radical oxidation or RF sputtering. Composite fixed layer 507, including dusting layer 504, spacer 505, and reference layer 506, may comprise any of the materials, structures, and thicknesses listed above with respect to composite fixed layer 107 of FIG. 1 in some embodiments. In other embodiments of a PMA magnetic stack with a fixed layer SAF structure and a dipole layer, composite fixed layer 507 may be a simple fixed layer comprising an appropriate magnetic material, omitting dusting layer 504 and spacer 505.

In FIG. 6, PMA magnetic stack 600 includes a fixed layer SAF structure including composite fixed layer 606 anti-parallelly coupled through SAF spacer 602 to bottom reference layer 601. Bottom reference layer 601 may comprise Co|Ni, Co|Pd or Co|Pt, in multilayers or a mixture. SAF spacer 602 may comprise Ru, and may be from about 8 angstroms to about 10 angstroms thick in some embodiments. The dipole layer 609 may comprise CoCrPt, Co|Ni, Co|Pd, or Co|Pt multilayers in some embodiments. To increase the magnetic moment and reduce the thickness of the dipole layer 609, a CoFeB dusting layer (not shown), which has relatively large saturation moment, may be grown directly on the bottom of the CoCrPt, Co|Ni, Co|Pd, or Co|Pt multilayers as part of the dipole layer 609 in some embodiments. Dipole layer 609 is magnetized in a direction that is the same as that of bottom reference layer 601 and opposite to that of the reference layer 603 to cancel out the fixed layer dipole field and reduce the loop offset of the free layer 608. A cap layer 610 located between the free layer 608 and dipole layer 609 provides magnetic separation between the dipole layer 609 and free layer 608. Tunnel barrier 607 comprises an insulating material such as MgO. An MgO tunnel barrier 607 can be formed by natural oxidation, radical oxidation or RF sputtering. Free layer 608 may include CoFeB with various compositions; the Co composition may be less than 90% and the Fe may be from about 10% to about 100% (pure Fe) in various embodiments. Free layer 608 may also comprise CoFeB|Fe or Fe|CoFeB. Composite fixed layer 606, with dusting layer 605, spacer 604, and reference layer 603, may comprise any of the materials, structures, and thicknesses listed above with respect to composite fixed layer 107 of FIG. 1 in some embodiments. In other embodiments of a PMA magnetic stack with a fixed layer SAF structure and a dipole layer, composite fixed layer 606 may be a simple fixed layer comprising an appropriate magnetic material, omitting dusting layer 605 and spacer 604.

The dipole fields generated by top reference layer 509/bottom reference layer 601 and dipole layers 510 and 609 in FIGS. 5 and 6 together compensate the dipole field generated by the reference layer 506/603. As long as the $H_c$ of composite fixed layer 507/606 is either greater or less than the $H_c$ of both the top reference layer 509/bottom reference layer 601 and the dipole layer 510/609, the magnetization of the three layers can be adjusted to reduce the offset field of free layer 502/608.

Figure 7:
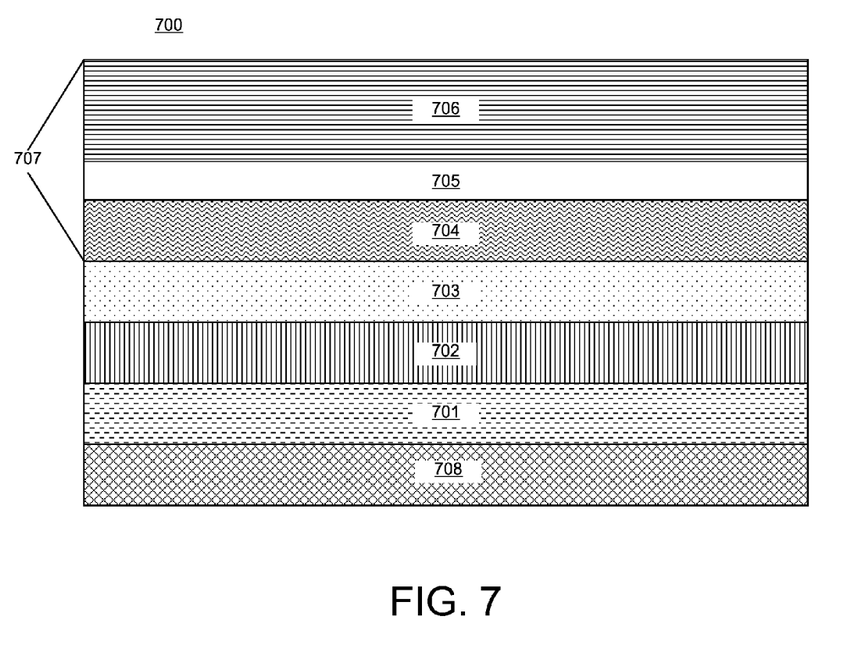
FIG. 7 is a cross sectional view illustrating an embodiment of a magnetic stack with a composite fixed layer on top of the magnetic stack, and a dipole layer on the bottom of the magnetic stack.
Figure 8:
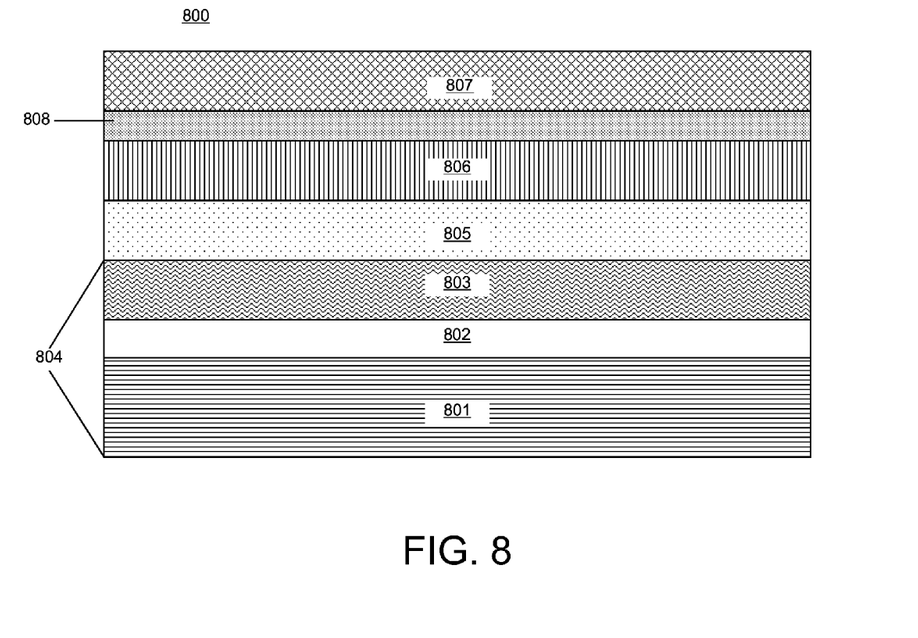
FIG. 8 is a cross sectional view illustrating an embodiment of a magnetic stack with a composite fixed layer on the bottom of the magnetic stack, and a dipole layer on top of the magnetic stack.

A dipole layer that is magnetized in a direction opposite to the fixed layer may also be used to cancel out the fixed layer dipole field and center the magnetization loop of the free layer in the absence of a fixed layer SAF structure, as shown in FIGS. 7 and 8. In FIG. 7, PMA magnetic stack 700 includes a composite fixed layer 707 and a dipole layer 708. The dipole layer 708 may comprise CoCrPt, Co|Ni, Co|Pd, or Co|Pt multilayers in some embodiments. To increase the magnetic moment and reduce the thickness of the dipole layer 708, a CoFeB dusting layer (not shown), which has relatively large saturation moment, may be grown directly on top of the CoCrPt, Co|Ni, Co|Pd, or Co|Pt multilayers as part of the dipole layer 708 in some embodiments. A seed layer 701 located between the free layer 702 and dipole layer 708 provided magnetic separation between the dipole layer 708 and free layer 702. Seed layer 701 may include Ta, or TaMg with a percentage of Mg that is less than 20%, in some embodiments. The seed layer 701 thickness may be 0.5 nm or more, and from about 1 nm to about 3 nm in some exemplary embodiments. Free layer 702 may include CoFeB with various compositions; the Co composition may be less than 90% and the Fe may be from about 10% to about 100% (pure Fe) in various embodiments. Free layer 702 may also comprise CoFeB|Fe or Fe|CoFeB. The thickness of the free layer 702 may be from about 0.6 nm to about 2 nm depending on the free layer composition. Tunnel barrier 703 is located on free layer 702, and comprises an insulating material such as MgO. An MgO tunnel barrier 703 can be formed by natural oxidation, radical oxidation or RF sputtering. Composite fixed layer 707, with dusting layer 704, spacer 705, and reference layer 706, may comprise any of the materials, structures, and thicknesses listed above with respect to composite fixed layer 107 of FIG. 1 in some embodiments. In other embodiments of a PMA magnetic stack with a dipole layer, composite fixed layer 707 may be a simple fixed layer comprising an appropriate magnetic material, omitting dusting layer 704 and spacer 705.

In FIG. 8, PMA magnetic stack 800 includes composite fixed layer 804 and a dipole layer 807. The dipole layer 807 may comprise CoCrPt, Co|Ni, Co|Pd, or Co|Pt multilayers in some embodiments. To increase the magnetic moment and reduce the thickness of the dipole layers 807, a CoFeB dusting layer (not shown), which has relatively large saturation moment, may be grown directly on the bottom of the CoCrPt, Co|Ni, Co|Pd, or Co|Pt multilayers as part of the dipole layer 807 in some embodiments. A cap layer 808 located between the free layer 806 and dipole layer 807 provides magnetic separation between the dipole layer 807 and free layer 806. Tunnel barrier 805 comprises a insulating material such as MgO. An MgO tunnel barrier 805 can be formed by natural oxidation, radical oxidation or radiofrequency (RF) sputtering. Free layer 806 may include CoFeB with various compositions; the Co composition may be less than 90% and the Fe may be from 10% to about 100% (pure Fe) in various embodiments. Free layer 806 may also comprise CoFeB|Fe or Fe|CoFeB. Composite fixed layer 804, with dusting layer 803, spacer 802, and reference layer 801, may comprise any of the materials, structures, and thicknesses listed above with respect to composite fixed layer 107 of FIG. 1 in some embodiments. In other embodiments of an PMA magnetic stack with a dipole layer, composite fixed layer 804 may be a simple fixed layer comprising an appropriate magnetic material, omitting dusting layer 803 and spacer 802.

In the PMA magnetic stacks 700 and 800 of FIGS. 7 and 8, the dipole layer 708/807 and the reference layer 706/801 are magnetized to opposite directions, such that their dipole fields cancel each other. The $H_c$ of the dipole layer 708/807 and the $H_c$ of the reference layer 706/801 may not be equal. A wide resetting field window can be achieved compared to the SAF/dipole PMA magnetic stacks 500 and 600 of FIGS. 5 and 6. However, a relatively thick dipole layer 708/807 is required in PMA magnetic stacks 700 and 800 of FIGS. 7 and 8, as compared to the SAF/dipole PMA magnetic stacks 500 and 600 of FIGS. 5 and 6.

The technical effects and benefits of exemplary embodiments include PMA magnetic stacks for MTJs having a relatively high magnetoresistance and a relatively low fixed layer dipolar field and free layer offset loop.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method of forming a magnetic tunnel junction (MTJ) for a magnetic random access memory (MRAM), the method comprising:
   forming a magnetic free layer having a variable magnetization direction;
   forming a tunnel barrier over the free layer, the tunnel barrier comprising an insulating material;
   forming a magnetic fixed layer having an invariable magnetization direction over the tunnel barrier, wherein the free layer and the fixed layer have perpendicular magnetic anisotropy; and
   forming:
      a composite fixed layer having an invariable magnetization direction, the composite fixed layer disposed adjacent the tunnel barrier such that the tunnel barrier is located between the free layer and the fixed layer, wherein the free layer and the composite fixed layer have perpendicular magnetic anisotropy, the composite fixed layer comprising a dusting layer, a spacer layer, and a reference layer, wherein the spacer layer is located between the reference layer and the tunnel barrier, and wherein the dusting layer is located between the spacer layer and the tunnel barrier, wherein the dusting layer and the reference layer are magnetically coupled through the spacer layer and have perpendicular magnetic anisotropy;
      a synthetic antiferromagnetic (SAF) fixed layer structure, the SAF fixed layer structure comprising a SAF spacer located between the composite fixed layer and a second fixed magnetic layer, wherein the composite fixed layer and the second fixed magnetic layer are anti-parallelly coupled through the SAF spacer; and
      a dipole layer, wherein the free layer is located between the dipole layer and the tunnel barrier.

2. The method of claim 1, wherein forming the free layer comprises growing the free layer on a seed layer comprising one of tantalum (Ta) or tantalum magnesium (TaMg), and wherein the seed layer has a thickness from about 0.5 nanometers (nm) to about 3 nm.

3. The method of claim 1, wherein the tunnel barrier comprises magnesium oxide (MgO) and is formed by one of natural oxidation, radical oxidation, and radiofrequency (RF) sputtering.

4. The method of claim 1, wherein the composite fixed layer is magnetized in a direction opposite to a magnetization direction of the second fixed magnetic layer in the SAF structure.

5. The method of claim 1, wherein the MTJ comprises both the dipole layer and the SAF structure, and the dipole layer and the second fixed magnetic layer of the SAF structure are magnetized in the same direction, and the composite fixed layer is magnetized in a direction that is opposite to the magnetization direction of the dipole layer and the second fixed magnetic layer.

6. The method of claim 1, wherein the dipole layer is magnetized in a direction opposite to a magnetization direction of the composite fixed layer.

7. The method of claim 1, wherein the free layer comprises one of cobalt-iron-boron (CoFeB), pure iron (Fe), CoFeB|Fe and Fe|CoFeB, and the composite fixed layer comprises one of cobalt-platinum (Co|Pt) and cobalt-palladium (Co|Pd).

8. A magnetic tunnel junction (MTJ) for a magnetic random access memory (MRAM), comprising:
   a magnetic free layer, having a variable magnetization direction;
   an insulating tunnel barrier located adjacent to the free layer;
   a composite fixed layer having an invariable magnetization direction, the composite fixed layer disposed adjacent the tunnel barrier such that the tunnel barrier is located between the free layer and the fixed layer, wherein the free layer and the composite fixed layer have perpendicular magnetic anisotropy; the composite fixed layer comprising a dusting layer, a spacer layer, and a reference layer, wherein the spacer layer is located between the reference layer and the dusting layer, and wherein the dusting layer is located between and adjacent to the spacer layer and the tunnel barrier, wherein the dusting layer and the reference layer are magnetically coupled through the spacer layer and have perpendicular magnetic anisotropy;
   a synthetic antiferromagnetic (SAF) fixed layer structure, the SAF fixed layer structure comprising a SAF spacer located between the composite fixed layer and a second fixed magnetic layer, wherein the composite fixed layer and the second fixed magnetic layer are anti-parallelly coupled through the SAF spacer; and
   a dipole layer, wherein the free layer is located between the dipole layer and the tunnel barrier.

9. The MTJ of claim 8, wherein the free layer comprises one of cobalt-iron-boron (CoFeB), pure iron (Fe), CoFeB|Fe and Fe|CoFeB.

10. The MTJ of claim 8, further comprising a seed layer underneath the free layer, the seed layer comprising one of tantalum (Ta) or tantalum magnesium (TaMg), and wherein the seed layer has a thickness from about 0.5 nanometers (nm) to about 3 nm.

11. The MTJ of claim 8, wherein the tunnel barrier comprises magnesium oxide (MgO).

12. The MTJ of claim 8, wherein the dusting layer of the composite fixed layer comprises one of CoFeB, CoFe, Fe, bilayers of Fe|CoFeB, bilayers of CoFe|CoFeB, bilayers of CoFeB|Fe, and bilayers of CoFeB|CoFe.

13. The MTJ of claim 8, wherein the dusting layer of the composite fixed layer has a thickness from about 0.5 nm to about 2 nm.

14. The MTJ of claim 8, wherein the spacer layer of the composite fixed layer comprises a non-magnetic material.

15. The MTJ of claim 8, wherein the spacer layer of the composite fixed layer comprises one of chromium (Cr), ruthenium (Ru), titanium nitride (TiN), titanium (Ti), vanadium (V), tantalum (Ta), tantalum nitride (TaN), aluminum (Al), magnesium (Mg) and MgO.

16. The MTJ of claim 8, wherein the spacer layer of the composite fixed layer comprises a tri-layer structure comprising a center magnetic spacer layer disposed between two non-magnetic spacer layers.

17. The MTJ of claim 16, wherein the center magnetic spacer layer comprises one of CoFeB, Fe, and CoFe.

18. The MTJ of claim 16, wherein the center magnetic layer has a thickness from about 0.1 nm to about 0.5 nm.

19. The MTJ of claim 8, wherein the composite fixed layer comprises one of cobalt-platinum (Co|Pt) and cobalt-palladium (Co|Pd).

20. The MTJ of claim 8, wherein the SAF spacer comprises ruthenium, and wherein the second fixed magnetic layer comprises one of cobalt-nickel (Co|Ni), Co|Pd and Co|Pt.

21. The MTJ of claim 8, wherein the dipole layer comprises one of cobalt chromium platinum (CoCrPt), Co|Ni, Co|Pd, and Co|Pt multilayers.

22. The MTJ of claim 21, wherein the dipole layer further comprises a CoFeB layer.

23. The MTJ of claim 8, wherein the composite fixed layer is magnetized in a direction opposite to a magnetization direction of the second fixed magnetic layer in the SAF structure.

24. The MTJ of claim 8, wherein the MTJ comprises both the dipole layer and the SAF structure, and the dipole layer and the second fixed magnetic layer of the SAF structure are magnetized in the same direction, and the composite fixed layer is magnetized in a direction that is opposite to the magnetization direction of the dipole layer and the second fixed magnetic layer.

25. The MTJ of claim 8, wherein the dipole layer is magnetized in a direction opposite to a magnetization direction of the composite fixed layer.

* * * * *